United States Patent
Buondelmonte et al.

(10) Patent No.: US 6,188,579 B1
(45) Date of Patent: Feb. 13, 2001

(54) APPARATUS AND METHODS FOR FORMING A PRINTED WIRING BOARD ASSEMBLY TO REDUCE PALLET WARPAGE

(75) Inventors: Charles Joseph Buondelmonte, Yardley, PA (US); Walter J. Picot, Boonton, NJ (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/351,551

(22) Filed: Jul. 12, 1999

(51) Int. Cl.[7] ........................................ H05K 7/20
(52) U.S. Cl. .................. 361/719; 361/707; 361/711; 361/712; 361/720; 361/753; 361/809; 257/707; 257/711; 257/718; 438/121; 438/122; 29/831; 29/854
(58) Field of Search .................... 361/707, 709, 361/710, 711, 712, 719, 720, 753, 761, 764, 809; 257/699, 707, 708, 711, 718, 719; 174/52.1; 438/121, 122; 29/830, 831, 852, 854

(56) References Cited

U.S. PATENT DOCUMENTS

| | | | |
|---|---|---|---|
| 3,982,271 | * 9/1976 | Olivieri et al. | 257/719 |
| 4,126,882 | * 11/1978 | Carson et al. | 361/761 |
| 4,538,124 | * 8/1985 | Morrison | 174/52.1 |
| 4,764,847 | * 8/1988 | Eisenblatter et al. | 257/718 |
| 5,450,284 | 9/1995 | Wekell | 361/710 |
| 5,561,592 | * 10/1996 | Furutani et al. | 361/719 |
| 5,784,782 | * 7/1998 | Boyko et al. | 29/830 |
| 5,998,241 | * 12/1999 | Niwa | 438/122 |
| 6,011,304 | * 1/2000 | Mertol | 257/718 |
| 6,018,193 | * 1/2000 | Rubens et al. | 257/718 |
| 6,122,170 | * 9/2000 | Hirose et al. | 361/719 |

* cited by examiner

Primary Examiner—Jeffrey Gaffin
Assistant Examiner—John B. Vigushin
(74) Attorney, Agent, or Firm—Duane, Morris & Heckscher LLP

(57) ABSTRACT

A printed wiring board assembly includes a pallet that is coupled to the bottom surface of a printed wiring board. An insert is provided having a first portion that is slidably mounted to the pallet and a second portion that is bonded to the bottom surface of the printed wiring board so that the insert is movable, relative to the pallet, in a plane parallel to the PWB. In one embodiment, the pallet includes an opening having a first portion and a second portion that is larger than the first portion, and the first and second portions of the insert fit at least partially in the respective first and second portions of the pallet opening. In another embodiment, the insert has a thickness that is equal to or greater than the thickness of the pallet.

19 Claims, 2 Drawing Sheets

APPARATUS AND METHODS FOR FORMING A PRINTED WIRING BOARD ASSEMBLY TO REDUCE PALLET WARPAGE

FIELD OF THE INVENTION

This invention concerns apparatus and methods for forming printed wiring board assemblies.

BACKGROUND OF THE INVENTION

Solid-state circuits typically include transistors or other active devices that are mounted to printed wiring board (PWB) assemblies. In a typical configuration, a PWB assembly is formed by bonding a pallet to the bottom surface of a printed wiring board. The pallet acts as a heat sink to draw heat from the transistors and related componentry, a circuit to ground, and a structural support for the PWB.

The printed wiring board is generally provided with an opening that is aligned with a corresponding pocket formed in the pallet. The transistor is positioned in the pocket and protrudes through the opening in the PWB. The transistor leads are connected to the PWB, and the bottom of the transistor casing is coupled to the pallet.

A permanent warpage or bending of the newly formed PWB assembly can occur as the composite structure cools to normal operating or room temperatures. The warpage typically occurs in PWB assemblies having a significant size, wherein the various materials used in constructing the PWB assembly have differing coefficients of thermal expansion (CTE). The magnitude of the warpage can be severe enough to impede the process of bonding components to the PWB assembly and render ineffective conventional techniques used to transfer the dissipated heat from the operating electronic assembly to an attached heat sink.

Accordingly, improved constructions and methods of forming printed wiring board assemblies are desirable.

SUMMARY OF THE INVENTION

A printed wiring board assembly formed in accordance with the invention includes a pallet that is coupled to the bottom surface of a printed wiring board. An insert is provided having a first portion that is bonded to the bottom surface of the printed wiring board and a second portion that is slidably mounted to the pallet so that the insert is movable, relative to the pallet, in a plane parallel to the PWB.

BRIEF DESCRIPTION OF THE DRAWINGS

These and other features and advantages of the invention are more fully disclosed or rendered apparent from the following description of certain preferred embodiments of the invention, that are to be considered together with the accompanying drawings wherein like numbers refer to like parts and further wherein.

DETAILED DESCRIPTION

Figure 1:
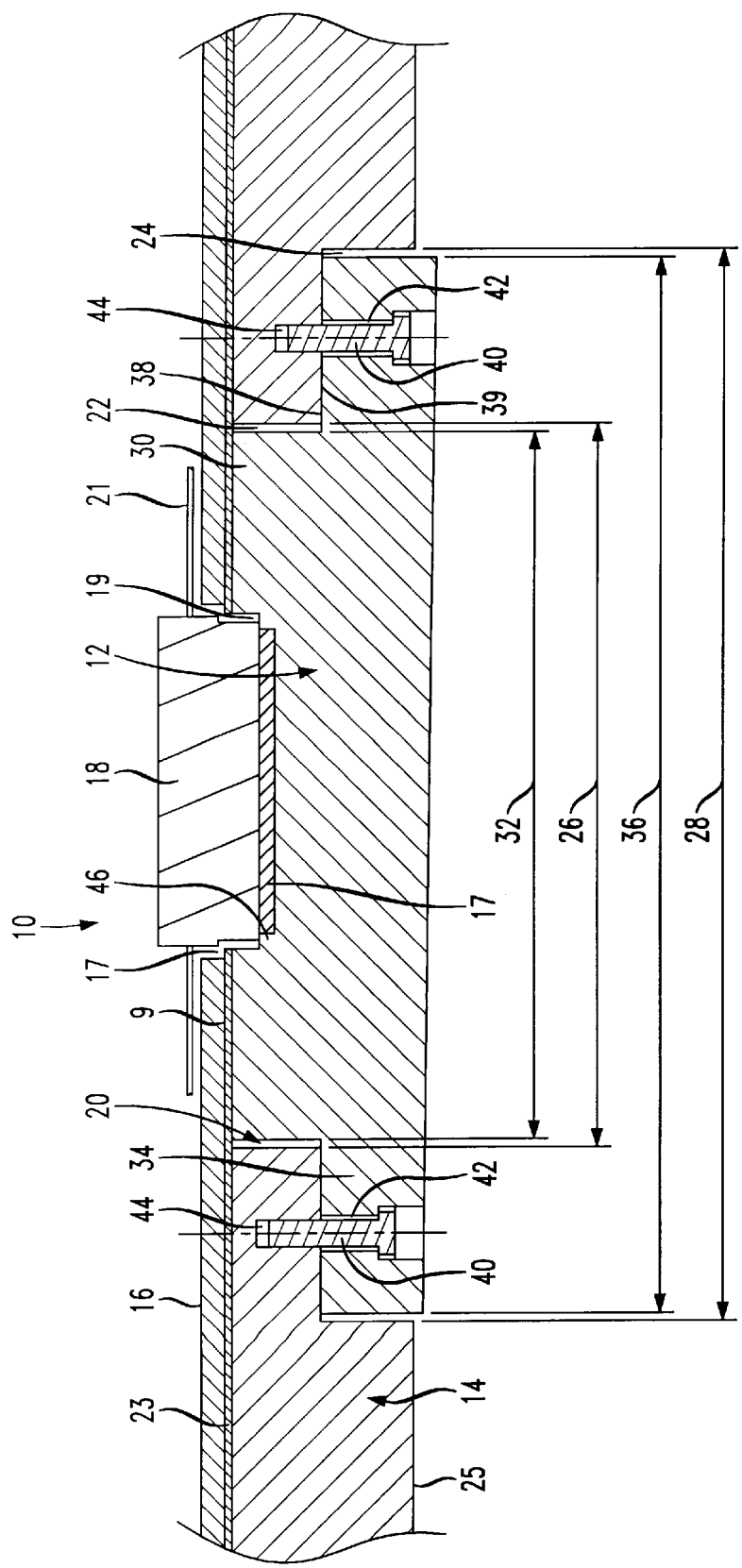
FIG. 1 is a cross-section elevational view of a printed wiring board assembly formed in accordance with the invention, shown having a transistor bonded to the insert.
Figure 2:
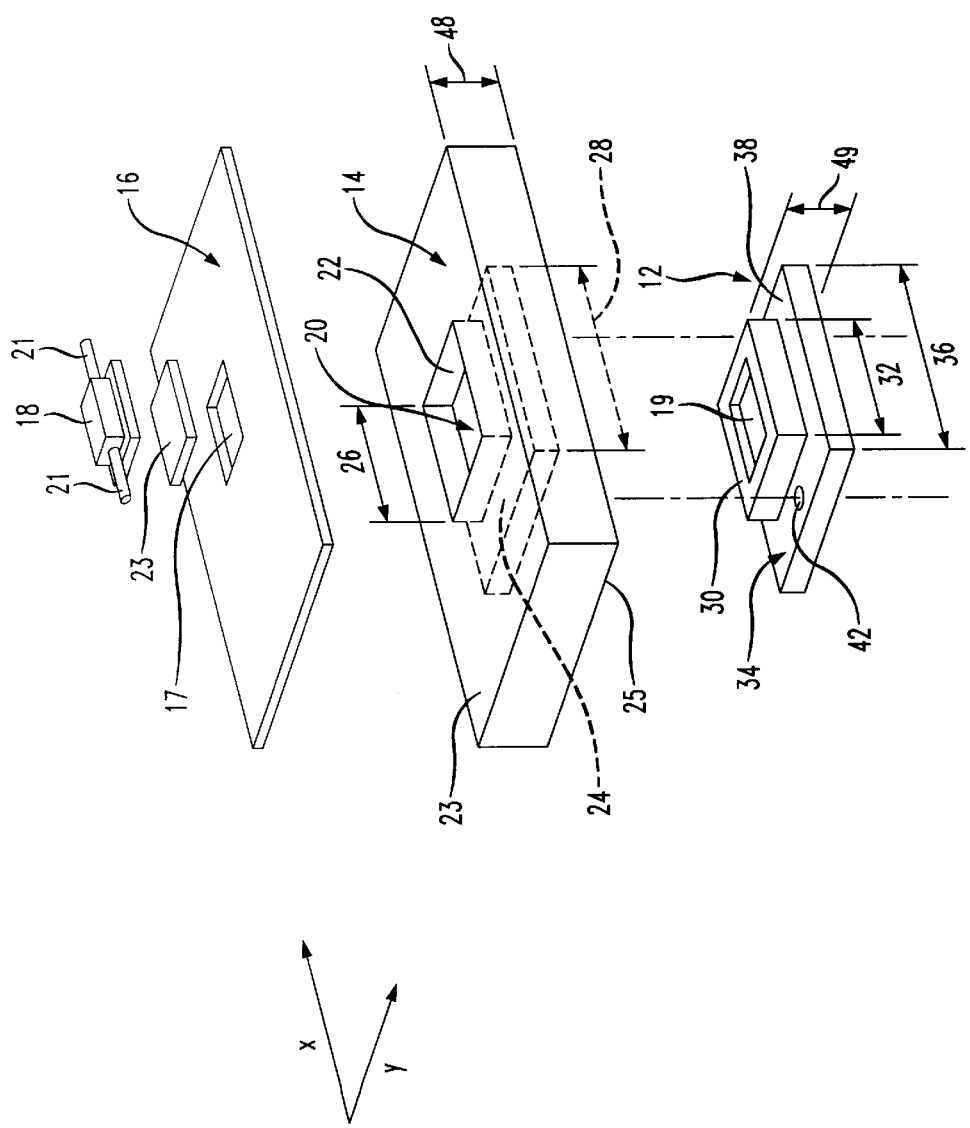
FIG. 2 is an exploded isometric view of the printed wiring board assembly shown in FIG. 1.

Referring to FIGS. 1 and 2, an assembly 10 in accordance with the invention includes an insert 12 mounted to a pallet 14. Both the insert 12 and the pallet 14 are coupled to the bottom surface of a printed wiring board (PWB) 16 with solder or adhesive 9. The printed wiring board includes an opening 17 which is aligned with a corresponding pocket 19 formed in the insert 12. The pocket 19 is shaped to receive a component which, in the embodiment shown, consists of a high-powered RF transistor 18. The transistor 18 is positioned in the pocket 19 and protrudes through the opening 17 in the PWB 16. The transistor leads 21 are connected to the PWB 16 and the bottom of the transistor casing is soldered to the insert 12 using a solder preform 23.

More particularly, pallet 14 has a thickness 48 and includes an opening 20 in which the insert 12 is mounted. The opening 20 is a through-cut that extends through the pallet 14 from the top surface 23 to the bottom surface 25, and includes first and second portions 22, 24. The first portion 22 of the opening has a length 26 and the second portion 24 has a length 28 that is greater than the length 26 of the first portion. The pallet 14 can be made from any material having suitable thermal and electrical properties, and is preferably formed of aluminum.

Insert 12 may be formed of any electrically conductive and solderable material and preferably is formed of metal. The insert 12 has a thickness 49 that is equal to or greater than the thickness 48 of the pallet 14. The insert 12 includes a main body or first portion 30 having a length 32, and a flange or second portion 34 having a length 36 that is greater than the length 32 of the first portion 30 of the insert. The first and second portions 30 and 34 of the metal insert 12 are dimensioned so that they can be inserted at least partially into the respective first and second portions of the opening 20 formed in the pallet. The first and second portions 30, 34 of the metal insert 12 are sized to fit within the respective first and second portions 22, 24 of the opening 20 with a clearance of between about 0.003 inches and 0.006 inches in both the X and Y planes (shown in FIG. 2). By virtue of this arrangement, the metal insert 12 can move, relative to the pallet 14, during assembly of the printed wiring board 16 to the pallet and the insert, in a plane parallel to the printed wiring board 16. The invention thus provides a means for accurately positioning a transisitor on the PWB assembly, while avoiding a structural connection between the insert 12 and the pallet 14. Although described in connection with mounting transistors, the invention can also be used for mounting other electrical components. Accordingly, it will be appreciated that both the size and shape of the pallet and the metal insert may be varied to accomodate particular needs.

The pocket 19 in metal insert 12 may also include one or more standoffs or lands 46 which support the transistor 18 above the bottom surface of the pocket. The standoffs 46 prevent the solder or adhesive 23 from being squeezed out from between the transistor 18 and the bottom of the pocket 19 during soldering, thus ensuring that a uniform solder thickness is maintained between the casing of the transistor 18 and the pocket 19. Experimental tests have shown that good solder joint performance and integrity are achieved when using a uniform solder thickness of at least about 0.006 inches, and preferably about 0.010 inches. Accordingly, the standoff height should be selected to provide a solder joint thickness in this range.

In a preferred embodiment, four standoffs 46 are utilized, one at each corner of the pocket 19. By locating the standoffs 46 at the periphery of the transistor 18, the solder joint surface area can be maximized at the center of the transistor bottom, where the heat generated by the transistor tends be the greatest. This arrangement optimizes heat transfer between the transistor 18 and the metal insert 12. It will be appreciated by those skilled in the art, that the location, size and number of standoffs provided in the metal insert may be varied to suit a particular application or mounting component.

The metal insert 12 can be formed of any material having suitable properties of thermal conductivity and diffusivity and coefficient of thermal expansion (CTE). Preferably, the CTE of the metal insert should approximate the CTE of the transistor casing to maximize the integrity of the solder joint provided therebetween. In a preferred embodiment, the metal insert 12 is formed of copper.

In the embodiment shown, the metal insert 12 is mounted in opening 20 so that it is movable, relative to the pallet 14, in a plane parallel with the printed wiring board 16. More particularly, a top surface 38 of the second portion 34 of the metal insert 12 is slidably mounted to a mating surface 39 of the pallet 14. In other words, the second portion 34 of the metal insert 12 can "float" relative to the mating surface 39 of the pallet 14. Mechanical fasteners 40 are used to secure the metal insert 12 to the pallet 14. The fasteners may be screws or other equivalent fasteners known in the art. The fasteners 40 extend through vertical bores 42 located in the second portion 34 of the metal insert 12 and are received by threaded holes 44 in the pallet. Fasteners 40 have a diameter that is slightly smaller than the corresponding bores 42 provided in the metal insert 12, in order to allow relative lateral movement between the metal insert 12 and the pallet 14. The fasteners 40 are tightened to a low torque that allows the metal insert 12 to move relative to the pallet 14 while maintaining contact with mating surface 39.

In one embodiment, the metal insert 12 is received in pallet opening 20 so that the insert 12 extends beyond the bottom surface 25 of the pallet 14. The protruding surface ensures good contact between the metal insert 12 and a heat sink (not shown) on which the pallet assembly is mounted. The insert 12 thus provides a direct and efficient thermal path between a transistor 18, that is mounted in the pocket 19 of insert 12, and a corresponding heat sink. For good thermal management, the metal insert 12 should extend beyond the bottom of the pallet 14 by between about 0.025 millimeter and about 0.1 millimeter (0.001 and 0.004 inches).

A PWB assembly 10 in accordance with the invention may be assembled as follows. Metal insert 12 is inserted in the pallet opening 20 and is secured to the pallet 14 using one or more fasteners 40. Thereafter, the top surfaces of both the metal insert 12 and the pallet 14 are simultaneously coupled to the bottom surface of a corresponding printed wiring board 16 by soldering or adhesive bonding. These structural and electrical connections are achieved at elevated temperatures using techniques commonly known to those skilled in the art. As the assembly cools to ambient or operating temperatures, the various materials contract at different rates due to the differing coefficients of thermal expansion (CTEs).

Because the pallet 14 and insert 12 are not structurally coupled (i.e., the insert "floats" in the pallet), the insert can slide relative to the pallet as the assembly cools, thereby avoiding any warpage or distortion of the assembly that would otherwise result from differing rates of contraction for the pallet 14 and the insert 12. Thus, the floating insert design avoids insert induced warpage of the PWB assembly.

Once the PWB subassembly is formed, a transistor or another electronic component can be mounted to the assembly. Before installing the transistor, a solder preform 23 is placed in the pocket 19 formed in the insert. The transistor 18 is then placed in the pocket of the insert on top of the solder preform 23 and positioned on the standoffs 46 so that the transistor leads 21 are aligned with corresponding solder lands on the PWB. The transistor 18 is pressed against the solder preform 23 (using conventional load fixtures) as transistor leads 21 are connected to the PWB 16 and as the solder preform 23 is reflowed in order to join the transistor 18 to the insert 12.

In addition to reducing warpage of PWB assemblies, the invention offer several other notable advantages. Location of transistor 18 on the PWB may be assured by the use of a pocket 19 and/or standoffs 46 to hold the transistor in a defined location (horizontally and vertically) on the insert 12. The tight tolerances provided around the perimeters of both the pallet opening 20 and the metal insert 12 hold the insert in position within the pallet opening relative to the PWB solder lands, while allowing horizontal movement of the insert during the PWB attachment process. Electrical and mechanical coupling between the printed wiring board 16 and both the pallet 14 and the metal insert 12 can be accomplished in the same process step. Improved thermal management is also achieved by eliminating the thermal pad or thermal grease provided between the metal insert and a corresponding pocket provided in pallet, as required in alternative constructions.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. An assembly comprising:
    a printed wiring board (PWB);
    a pallet coupled to a bottom surface of the PWB; and
    an insert having a first portion that is coupled to the bottom surface of the PWB and a second portion that is slidably mounted to the pallet, the second portion of the insert being capable of movement, relative to the pallet, in a plane substantially parallel to the PWB.

2. The assembly of claim 1 wherein the pallet has a thickness, and the insert has a thickness that is at least as thick as the thickness of the pallet.

3. The assembly of claim 1, further comprising a component coupled to the insert, the component projecting through an opening in the PWB.

4. The assembly of claim 3 wherein the component comprises a transistor.

5. The assembly of claim 4 wherein the transistor is soldered to the insert.

6. The assembly of claim 1, wherein the first portion of the insert has a length, and the second portion of the insert has a length that is greater than the first portion of the insert; the pallet has an opening having first and second portions; and the first and second portions of the insert fit at least partially in the respective first and second portions of the opening in the pallet.

7. The assembly of claim 6, wherein the second portion of the opening in the pallet is larger than the second portion of the insert, so that the insert is slidably movable in the pallet.

8. The assembly of claim 1, wherein the pallet is formed of aluminum and the insert is formed of copper.

9. The assembly of claim 1, wherein the insert is mounted to the pallet by at least one fastener that is loose enough to allow movement in the plane parallel to the PWB.

10. An assembly comprising:
    a printed wiring board (PWB);

a pallet coupled to a bottom surface of the PWB, the pallet having a thickness and an opening having first and second portions;

a metal insert having a thickness, a first portion that is coupled to the bottom surface of the PWB and a second portion that is slidably mounted to the pallet, the second portion being capable of movement, relative to the pallet, in a plane substantially parallel to the PWB, wherein the first portion of the insert has a length, and the second portion of the insert has a length that is greater than the first portion of the insert; and the first and second portions of the insert fit at least partially in the respective first and second portions of the opening in the pallet; and a transistor soldered to the metal insert.

11. The assembly of claim 10 wherein the thickness of the insert is at least as thick as the thickness of the pallet.

12. The assembly of claim 11 wherein the insert extends beyond the bottom surface of the pallet by between about 0.025 millimeters and about 0.1 millimeter.

13. A method for fabricating a printed wiring board (PWB) assembly comprising the steps of:

coupling a pallet to a bottom surface of a PWB;

coupling a first portion of a metal insert to the bottom surface of the PWB; and slidably mounting a second portion of the metal insert to the pallet.

14. The method of claim 13 wherein the respective steps of coupling a pallet to a bottom surface of a PWB and coupling a first portion of a metal insert to the bottom surface of the PWB comprise soldering the pallet to the bottom surface of the PWB and soldering the first portion of the metal insert to the bottom surface of the PWB.

15. The method of claim 14 wherein the respective steps of soldering the pallet to the bottom surface of the PWB and soldering the first portion of the metal insert to the PWB are performed simultaneously.

16. The method of claim 13, further comprising the step of coupling a component to the metal insert.

17. The method of claim 16 wherein the component is soldered to the metal insert.

18. The method of claim 17 wherein the component comprises a transistor.

19. The method of claim 13 wherein the pallet is formed of aluminum and the metal insert is formed of copper.

* * * * *